United States Patent [19]

Sunderland

[11] 4,319,199

[45] Mar. 9, 1982

[54] EFFICIENT POWER AMPLIFIER WITH STAGGERED POWER SUPPLY VOLTAGES

[75] Inventor: Richard A. Sunderland, Aloha, Oreg.

[73] Assignee: Tektronix, Inc., Beaverton, Oreg.

[21] Appl. No.: 106,075

[22] Filed: Dec. 20, 1979

[51] Int. Cl.³ .............................................. H03F 3/04
[52] U.S. Cl. .................................. 330/297; 330/255; 330/267; 330/295
[58] Field of Search ............... 330/255, 263, 267, 296, 330/297, 295

[56] References Cited

U.S. PATENT DOCUMENTS

| 4,117,418 | 9/1978 | Höglund | 330/296 |
| 4,158,179 | 6/1979 | Sakai et al. | 330/297 |
| 4,236,120 | 11/1980 | White | 330/297 X |

*Primary Examiner*—James B. Mullins

[57] ABSTRACT

An amplifier which minimizes the power loss in its output stages is described. This is achieved by operating the several output stages from separate power supplies operating at staggered voltage levels. The output stages, which have parallel signal paths, are unity-gain emitter follower circuits connected so that the follower operating from the lowest usable power supply voltage always delivers the load current. Control circuitry shifts the load current from one output stage to another based upon the instantaneous relationship between supply voltages and the output voltage. The shift between output stages introduces very little signal distortion into the output.

9 Claims, 9 Drawing Figures

EFFICIENT POWER AMPLIFIER WITH STAGGERED POWER SUPPLY VOLTAGES

BACKGROUND OF THE INVENTION

This invention relates to power amplifier circuits, and more specifically to a linear amplifier which minimizes power loss in its output devices. Originally optimized for driving an inductive load, namely a magnetic deflection yoke, the present invention is a power-efficient operational amplifier suitable for driving either resistive or reactive loads.

It is well known that the power supply for an amplifier which directly drives a load must have a supply voltage at least slightly greater than the maximum output voltage required by the load. The difference between the supply voltage and the instantaneous load voltage appears across the amplifier's output devices. Because load current also flows through the output devices, there is a consequent power loss through them. If to a first order, the supply current is nearly equal to the load current, then the efficiency of the amplifier, while driving a resistive load, is given by the following formula:

$$\text{Efficiency} = \frac{\text{Power Expended by Load Resistance}}{\text{Power Supplied by the Power Source}} = \frac{V_{load}}{V_{supply}}$$

From the above relationship, it is evident that efficiency increases as the load, or output, voltage approaches the supply voltage. In most amplifier applications, however, the load voltage varies and is less than maximum the majority of the time. Therefore, efficiency suffers the majority of the time as well. The common technique of using a class A amplifier powered by a supply voltage high enough to accommodate the highest expected output voltage exhibits this characteristic.

It has been recognized in the prior art that for an amplifier to drive a load efficiently at both high and low output voltages, the amplifier must be able to supply load current from a low voltage supply for low output voltages and from a higher voltage supply only during higher output voltages. This reduces the voltage drop across the amplifier output devices and, thus, improves its efficiency. Prior art techniques of multiple power supply operation include circuits similar to that illustrated in FIG. 1. These circuits use multiple output devices connected so that their inputs are effectively in parallel yet load current flows through them in series. For example, load current flows through only one output device from power supply $V_1$ for $V_{out} < V_1$, through two output devices from power supply $V_2$ for $V_{out} > V_1$, and so on. When these circuits operate from a power supply higher than the lowest, the input current of such amplifiers characteristically must increase by the quantum amount necessary to support conduction of an additional output device. A further quantum increase must occur when operating from a third supply higher in voltage than the second, and so on. Each increase in input current makes greater demands on the circuit driving the output devices and may cause distortion in the output signal during the shift from one power supply to another.

SUMMARY OF THE INVENTION

For increased power efficiency, the present invention operates its load-supplying output devices from a plurality of supplies of different voltage in such a manner that each output device is always operated to provide nearly its maximum output. Furthermore, the present invention exhibits less variation in its current gain as a function of which one of its supplies provides the load current than in prior art circuits. The invention utilizes several effectively parallel emitter follower output stages, each with a different supply voltage, and control circuits to shift enabling current from one emitter-follower stage to another. The control circuits ensure that the lowest usable supply provides the output current.

To minimize distortion which may be caused by the changeover from one output stage to another the present invention smoothes the changeover by spreading it over an acceptable range of output voltage. In passing through a transition range, the output stage which initially provided the entire load current reduces its share of the load smoothly from 100 percent to zero as the next highest voltage output stage's share increases from zero to 100 percent.

A conventional gain stage precedes the output stage and has a drive voltage swing equal to that of the total amplifier.

It is therefore an object of the present invention to provide a power amplifier circuit which has a high degree of efficiency.

It is another object of the present invention to provide an amplifier output stage whose current gain has minimum variation as a function of which one of its power supplies provides the load current.

It is still another object of the present invention to provide an amplifier output stage with very high current gain.

It is yet another object of this invention to provide a power-efficient general purpose power operational amplifier exhibiting a high full-power bandwidth and requiring no frequency compensation to achieve stable operation in most applications.

DESCRIPTION OF THE DRAWINGS

Various features and advantages of the present invention will become more apparent upon consideration of the following description taken in conjunction with the accompanying drawings wherein.

DETAILED DESCRIPTION OF THE PREFERRED EMBODIMENTS

Figure 2:
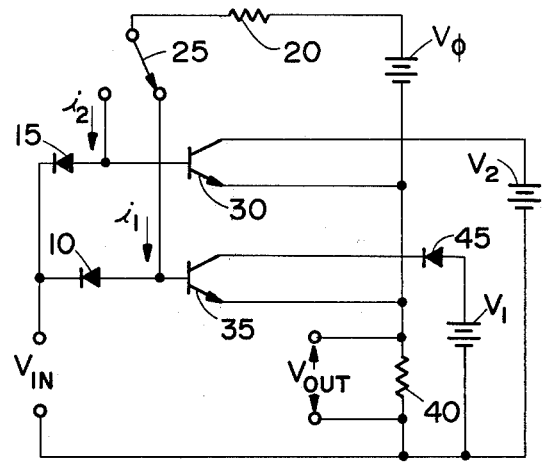
FIG. 2 is a basic amplifier output circuit utilizing the present invention.

The present invention utilizes output devices which are effectively in parallel and are selectively enabled so that the lowest usable power supply provides the load current. This has the effect of minimizing changes in current gain caused by operation from different power supplies. FIG. 2 illustrates a basic circuit according to my invention. Emitter follower transistors 30 and 35 are effectively connected in parallel and their common output can follow the input only when the base of one of the transistors receives current from resistor 20.

The input signal $v_{in}$ is coupled to the base of transistor 35 via diode 10 and to the base of transistor 30 via diode 15. The bases of transistors 30 and 35 are switchably connected to power supply $V_\phi$, a non-grounded source of current, via resistor 20. Switch 25 will supply current only to the base of transistor 35 for output voltages less than the voltage of power supply $V_1$ by a fixed amount and only to the base of transistor 30 for greater output voltages. The emitter of transistor 30 is connected to the emitter of transistor 35. This junction is connected to the negative side of the $V_\phi$ power supply and to one end of load resistor 40. The collector of transistor 30 is connected to the positive side of power supply $V_2$ while the collector of transistor 35 is connected via diode 45 to the positive side of power supply $V_1$. The output voltage of power supply $V_2$ is greater than the output voltage of power supply $V_1$. The negative sides of $V_1$ and $V_2$ and one end of load resistor 40 are returned to the input to complete the circuit.

In order to better understand the operation of the circuit of FIG. 2, assume that the input voltage, $v_{in}$ is such that switch 25 provides current to the base of transistor 35; i.e., $i_1$. This current will elevate the voltage at the base of transistor 35 above $v_{in}$ by an amount equal to the voltage drop across diode 10. The source of $v_{in}$ must be able to sink the current that flows through diode 10. The voltage at the emiter of transistor 35, i.e., $v_{out}$, will be less than the voltage at its base by an amount equal to its forward base-emitter junction voltage. These two voltage offsets cancel so that $v_{out}$ is very nearly equal to $v_{in}$. The output voltage will follow $v_{in}$ and load current will flow from power supply $V_1$ through diode 45 as long as $i_1$ is present. When $v_{out}$ is greater than the aforementioned threshold of switch 25, $i_1$ will be zero and $i_2$ will flow to the base of transistor 30. Under these conditions diode 15 and transistor 30 behave in a manner similar to that described for diode 10 and transistor 35. Diode 45 becomes reverse biased so that transistor 35 may be elevated above power supply $V_1$. Because currents $i_1$ and $i_2$ are supplied by $V_\phi$ instead of by $V_1$ or $V_2$, they are independent of output voltage $v_{out}$. Therefore, the amplifier can accommodate an output voltage from any power supply up to a saturation drop below that supply voltage. In order to obtain maximum output voltage, resistor 20 and the output voltage of power supply $V_\phi$ must be chosen to provide enough current to saturate transistor 30.

It may be seen from FIG. 2 that only transistor 30 need be enabled to supply load current from power supply $V_2$ and only transistor 35 need be enabled to supply load current from power supply $V_1$. In the prior art circuit of FIG. 1, however, both transistors require base current to supply load current from supply $V_2$, while only transistor 4 requires base current to supply load current from power supply $V_1$.

Figure 1:
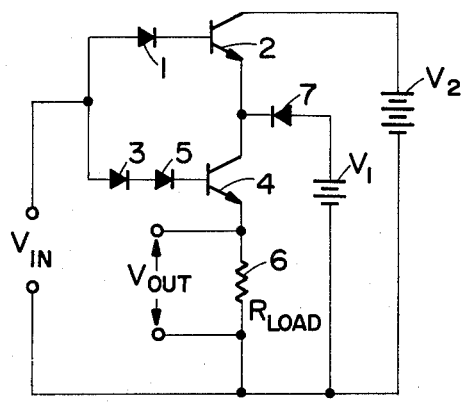
FIG. 1 illustrates the prior art.
Figure 3:
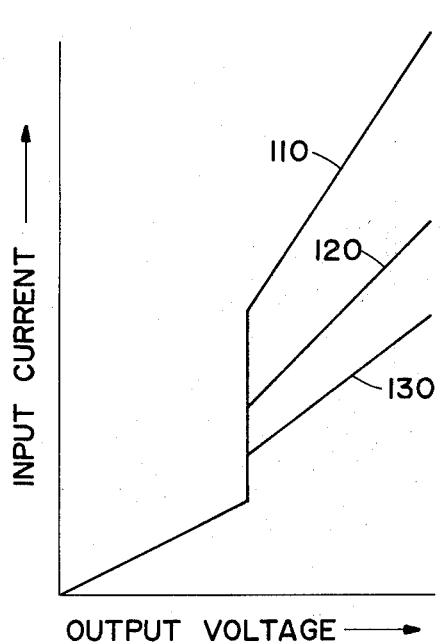
FIG. 3 is a graph of the input current of the prior art circuit of FIG. 1.
Figure 4:
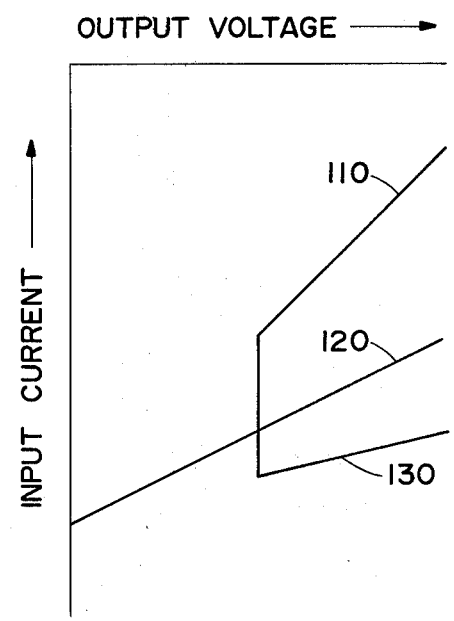
FIG. 4 is a graph of the input current of the circuit of FIG. 2.

Refer now to FIG. 3 which shows the input current for the prior art circuit of FIG. 1 as a function of output voltage into a resistor; i.e., output current. Line 110 illustrates the conditions when the $\beta$, or current gain, of transistor 2 is equal to one half of the $\beta$ of transistor 4; line 120 illustrates the conditions when the two $\beta$'s are equal; and line 130 illustrates the conditions when the $\beta$ of transistor 2 is twice the $\beta$ of transistor 4. FIG. 4 illustrates the same conditions for the present invention wherein transistor 30 corresponds to transistor 2 and transistor 35 corresponds to transistor 4. It can be seen for the case when the $\beta$'s are equal, there will be no discontinuities in the input current. Unless matched parts are used, the transistors will have unequal $\beta$'s and discontinuities will occur in either circuit. However, the circuit of FIG. 2 will have a discontinuity that is no worse than, and normally less abrupt than that for the prior art circuit of FIG. 1 if the same type transistors are used in each.

Figure 5:
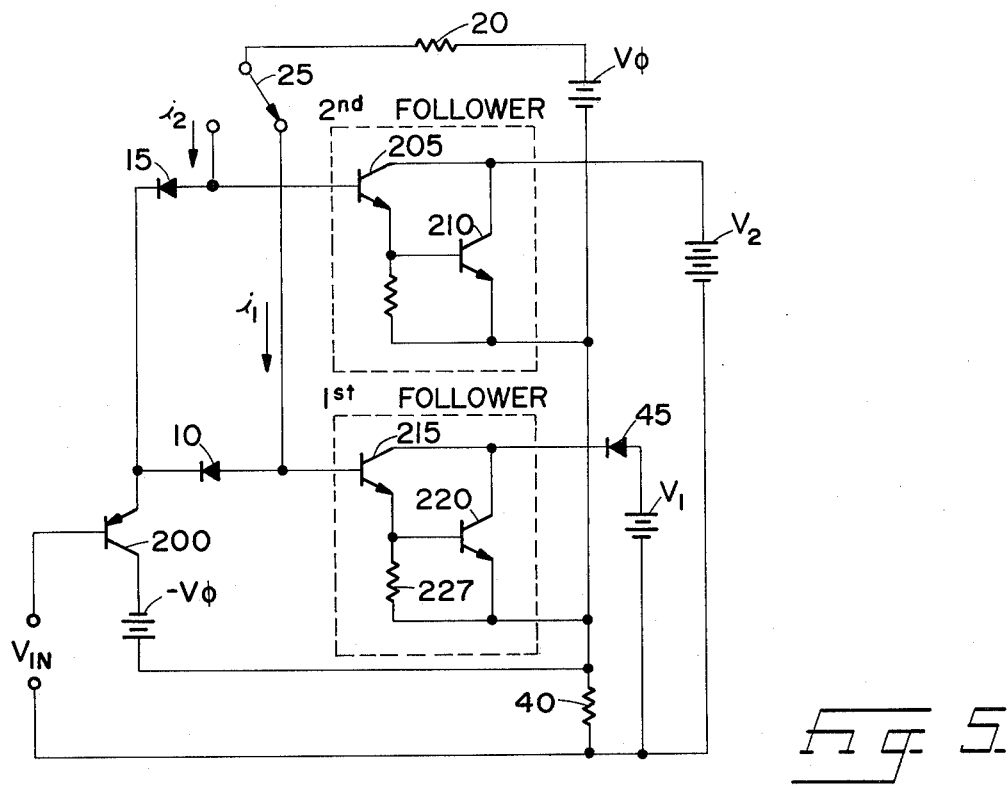
FIG. 5 is another embodiment of the present invention.

A second embodiment of the present invention is shown in FIG. 5. Those skilled in the art will recognize this circuit as having a much higher current gain than the embodiment of FIG. 2. Because the first follower comprising transistors 215 and 220 and the second follower comprising transistors 205 and 210 are connected in Darlington configurations, which possess the characteristic that the current gain of the configuration is equal to the product of the current gains of the individual transistors, $i_1$ and $i_2$ may be reduced significantly. Furthermore, transistor 200 further reduces the input current of the amplifier by a factor equal to its current gain.

A graph of the input current for the embodiment of FIG. 5 would be similar in shape to that of FIG. 4 since the fundamental operation of the embodiments of FIG. 2 and FIG. 5 is the same.

Power supplies $-V_\phi$ and $V_\phi$ are non-grounded supplies referenced to the output node. Because of this connection, the base-to-collector voltage of transistor 200 changes very little over the entire output voltage range. Thus, very little of transistor 200's base current is required to charge its collector-to-base capacitance (as multiplied by the well-known Miller effect) with the result that the capacitance seen at the amplifier's input is minimized. This reduction in input capacitance greatly increases the speed and frequency response of the total amplifier over that of an amplifier identical to FIG. 5 except that the collector of transistor 200 is connected to ground instead of $-V_\phi$.

The abruptness of the discontinuities in FIG. 4 may be lessened by replacing the enabling current switch 25 of FIG. 2 and FIG. 5 with a circuit to divide the enabling current between $i_1$ and $i_2$ in a manner directly proportional to the output voltage over a suitably small voltage range thereof. Such a circuit is illustrated in amplifier 250 of FIG. 6, and is hereinafter referred to as a control circuit. The blocks labelled "1st Follower" and "2nd Follower" contain circuitry found inside the identically labelled dashed blocks of FIG. 5. The input signal enters the circuit at the base of PNP transistor 200 which acts as a buffer. The emitter of transistor 200 connects to the input of the first follower stage at node A through diode 201 and to the corresponding part of the second follower through diode 214. The emitter of PNP transistor 206 is labelled as Node B in FIG. 6 and is connected to the base of transistor 206 via resistor 217. Node B connects to a Node A through resistor 209 and diode 207, and to a power supply $V_\phi$ through resistor 211. The collector of transistor 206 is connected to the input of the second emitter follower stage. The base of transistor 206 is connected to the collector of NPN transistor 204 through diode 213. The base of transistor 204 is connected to power supply $V_1$. The collectors of the first emitter follower are connected to power supply $V_1$ through diode 212.

Figure 6:
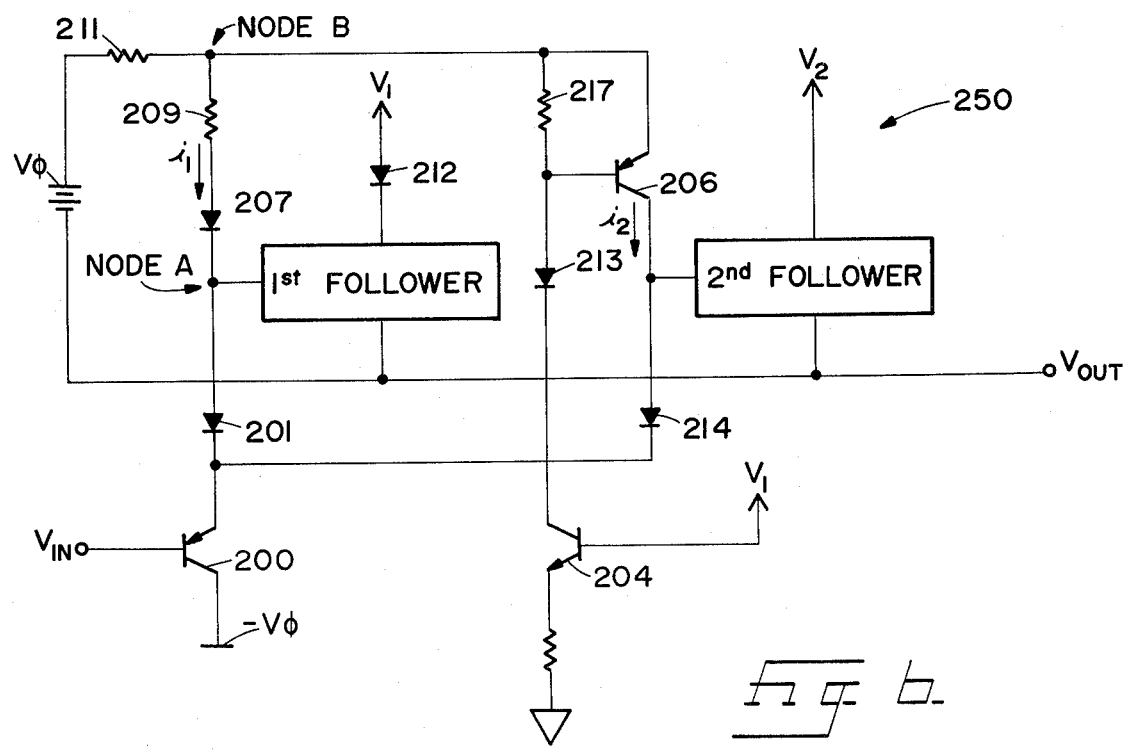
FIG. 6 illustrates the control circuits which may be utilized to replace switch 25 of FIG. 2 and FIG. 5.

The control circuit of FIG. 6 operates to shift enabling current from one emitter follower stage to the next according to the amplitude of the output voltage. The transition is spread over a range of output voltage. While the output voltage passes through a transition range, the emitter follower stage which initially supported the entire load current reduces its share of the load current smoothly from 100 percent to zero as the next emitter follower stage's share of load current increases from zero to 100 percent.

Figure 7:
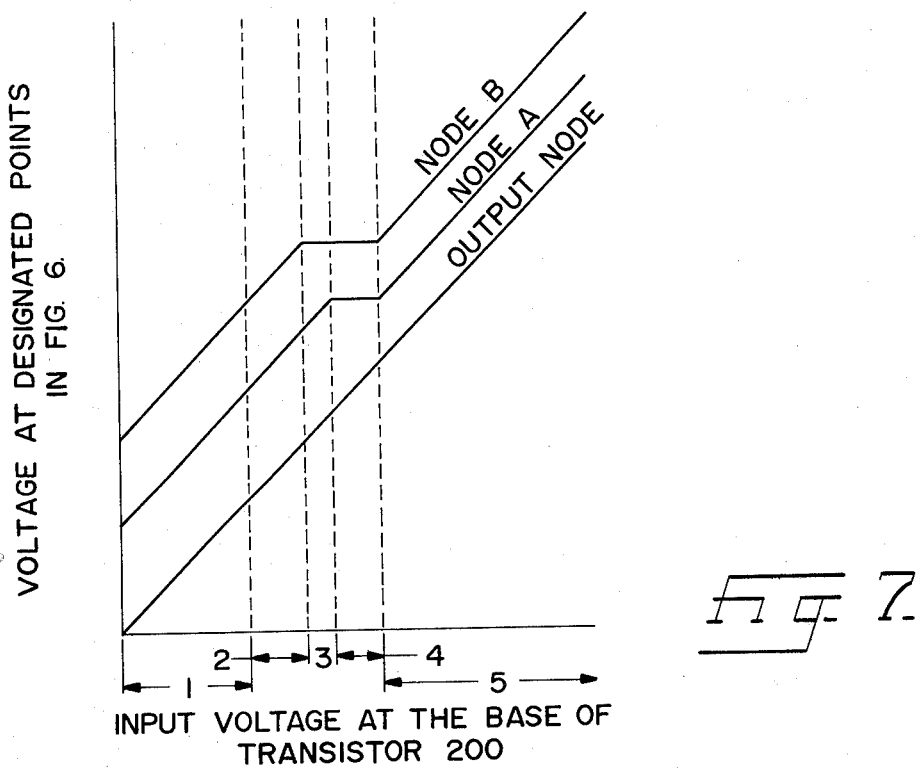
FIG. 7 is a graph of the voltage at various points in the circuit of FIG. 6.

FIG. 7 is a graph of the voltage at Node A, Node B, and the output node of the circuit of FIG. 6 as a function of input voltage. Operation of the control circuit can be correlated to different ranges of output voltages designated Ranges 1-5 in FIG. 7. A ramp output voltage as shown in FIG. 7, causes the following circuit conditions as the voltage passes through the above voltage ranges.

OUTPUT VOLTAGE RANGE 1

This range includes output voltages between zero and the output voltage for which the voltage at Node B is just high enough to turn on diode 213. In practice, this voltage is approximately equal to the output of power supply $V_1$ (if transistor 204 and diode 213 are either both germanium or both silicon devices). Prior to the turn on of diode 213, Node B is more positive than the output node by a fixed amount equal to the voltage drop across resistor 209, plus the voltage drop across diode 207, plus the sum of the base-emitter junction voltages of transistors 215 and 220.

Therefore the following conditions exist in this range: $V_B = V_{out}$ + the above-described fixed voltage; diode 213 is reverse biased; transistor 206 is cut off; and transistor 204 is saturated. Consequently, $i_2$ is zero, $i_1$ is greater than zero and only the first emitter follower is enabled. Thus, load current comes from only power supply $V_1$.

OUTPUT VOLTAGE RANGE 2

The width of this range is equal to the base-emitter junction voltage of transistor 206.

When diode 213 is on, current will flow through resistor 217 and affect the voltage at Node B. Since the purpose of resistor 217 is to keep transistor 206 off when diode 213 is off, its resistance value may be made much greater than that of resistor 211 so that the effect on Node B is negligible.

The following conditions exist in this range: $V_B = V_{out}$ + the fixed voltage described in Range 1; diode 213 is turned on; transistor 204 is saturated; and the voltage across resistor 217 increased from zero to the base-emitter junction voltage of transistor 206. Throughout this range transistor 206 remains off, $i_2$ is zero, and only the first emitter follower is enabled. Thus, power supply $V_1$ still supplies the entire load current.

OUTPUT VOLTAGE RANGE 3

It is in this range that the changeover from one power supply to another occurs. The width of this range is equal to the nearly fixed voltage drop across resistor 209 mentioned in the two previous ranges.

The following conditions exist in this range: Transistor 206 is in its active region; $V_B$ is fixed, by the conduction of transistor 206, at nearly one diode-drop above the output voltage of power supply $V_1$; transistor 204 is saturated; and the voltage across resistor 209 and thus $i_1$, decreases to nearly zero as the output voltage increases. Except for the fixed current through diode 213, the current leaving Node B is divided between $i_1$ and $i_2$. Therefore, as the voltage across resistor 209 decreases, $i_1$ decreases and $i_2$ increases in proportion. The first emitter follower is thereby smoothly disabled as the second emitter follower is smoothly enabled. Load current is supplied in varying proportions by both power supplies.

Since in this range the voltage at Node B remains fixed while the output rises, the voltage across and the current through resistor 211 also rises. If the sum of $i_1$ and $i_2$ is not constant, the emitter current of transistor 200 will not be constant. Thus, the input requirements of the amplifier output stage will change from one range to another. To force the sum of $i_1$ and $i_2$ to remain constant, the emitter current of transistor 204 may be chosen to equal the aforementioned increase in current in resistor 211. As long as the sum of $i_1$ and $i_2$ is held constant, fluctuations in input current must be due to a mismatch in current gains of the transistors in the first and second follower stages, and/or variations in the load current.

OUTPUT VOLTAGE RANGE 4

The upper boundary of this range occurs when transistor 206 enters saturation.

The following conditions exist in this range: $V_B$ is fixed at the same level as in Range 3; the voltage across resistor 227 (FIG. 5) drops from the base-emitter voltage of transistor 220 to nearly zero; transistor 204 is saturated; diode 213 is on; and transistor 206 is active. Current $i_1$ remains near zero so only the second emitter follower is enabled and power supply $V_2$ supplies all the load current.

OUTPUT VOLTAGE RANGE 5

In this range the following conditions exist: diode 213 is on; transistor 204 is active, and transistor 206 is saturated. Consequently, the second emitter follower is still enabled. Diode 212 allows the first follower stage to be operated above the output voltage of power supply $V_1$. Power supply $V_2$ supplies all the load current.

Figure 8:
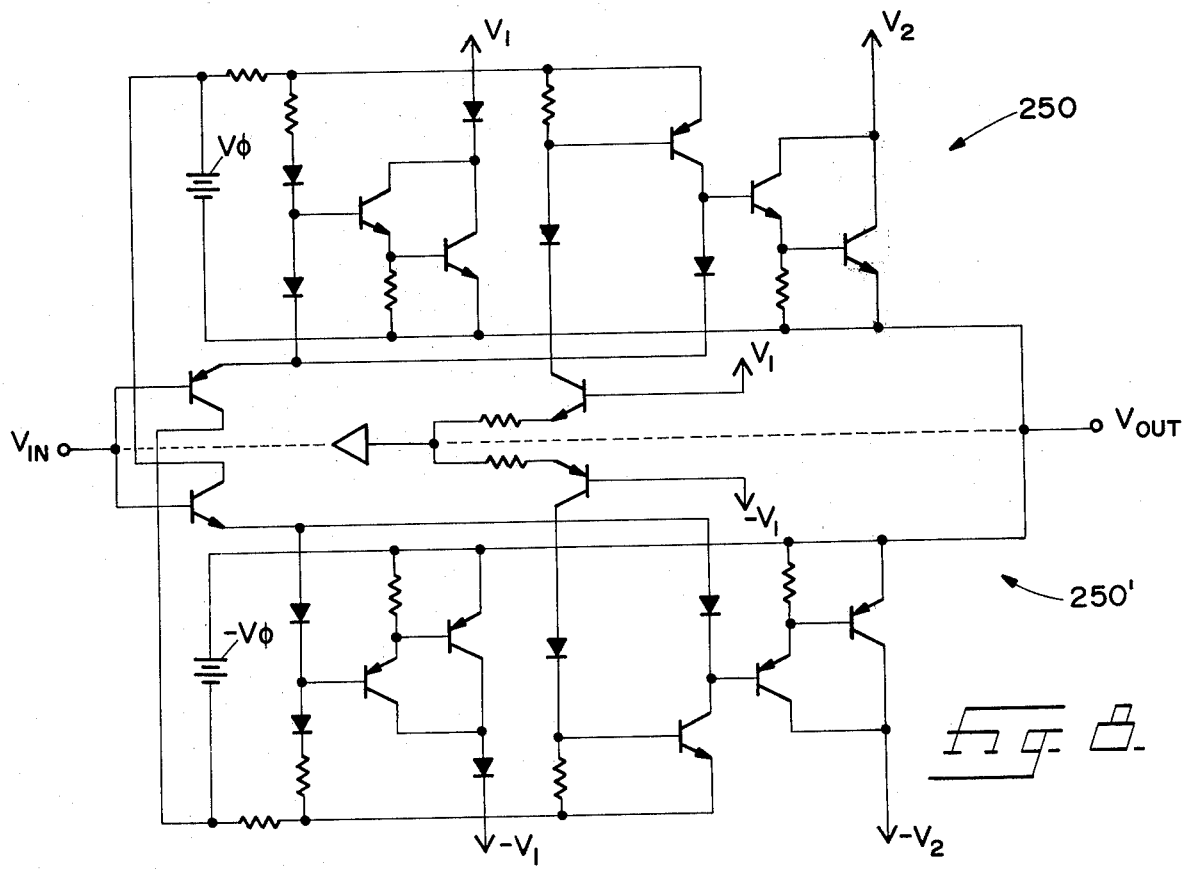
FIG. 8 is a schematic of a push-pull amplifier utilizing the present invention.

FIG. 8 is a simplified schematic of a push-pull amplifier embodying the present invention. This embodiment comprises two circuits of type show in FIG. 6, designated 250 and 250', one being an exact duplicate and the other being a so-called complementary circuit. In the complementary circuit, diode and power supply polarities are reversed and, NPN and PNP transistors interchanged.

Figure 9:
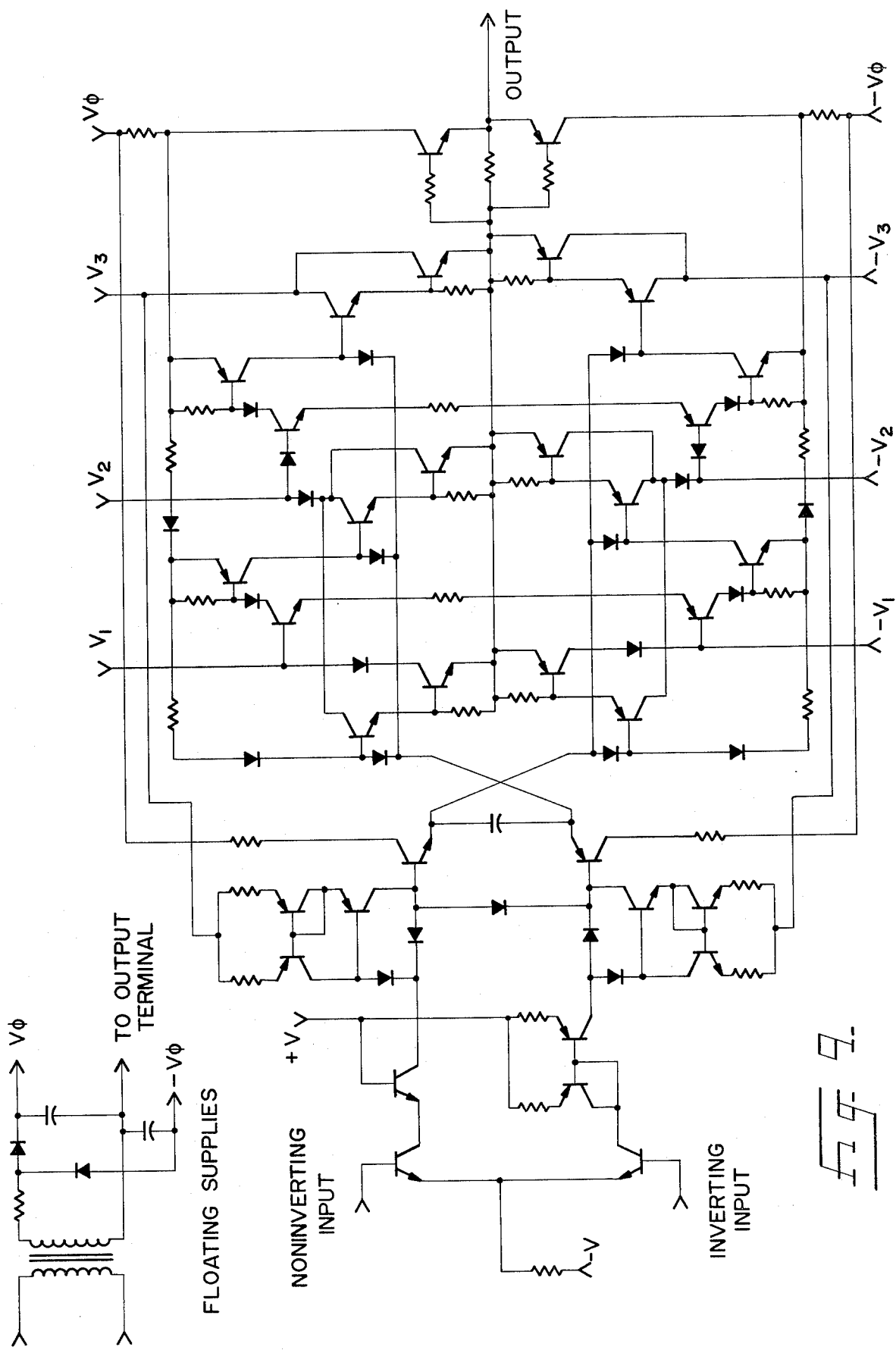
FIG. 9 is a complete operational amplifier utilizing the present invention.

FIG. 9 shows an embodiment of the present invention whereby the amplifier is expanded to include operation from three levels of power supply voltages. Furthermore, a conventional transconductance stage is included in order to form a complete operational amplifier.

In all embodiments of the present invention, the output voltages of power supplies $V_1$, $V_2$, $V_3$, $-V_1$, $-V_2$, and $-V_3$ may be selected to maximize power efficiency for individual applications. This is accomplished by careful consideration of the characteristics of the load to be driven and the character of expected output voltage.

In summary, what I have described is an amplifier which minimizes the power loss in its output buffer through the use of a plurality of output stages which operate from separate power supplies operating at staggered voltage levels. The output stages, which have parallel signal paths, are unity-gain emitter follower circuits configured such that the follower connected to the lowest usable power supply always delivers the load current. Thus, the difference between the supply voltage and output voltage is minimized and power is conserved.

It may be observed in the foregoing specification that it has not been encumbered by the inclusion of large amounts of detail relative to such matters as biasing and the like since all such information is well within the skill of the art. Therefore it will be apparent to those skilled in the art that many changes may be made to the preferred embodiments described herein without departing from the invention in its broader aspects. Consequently, the appended claims are intended to cover all such changes that fall within the scope of the invention.

I claim as my invention:

1. An amplifier circuit comprising:
   an input stage for producing a current proportional to an applied input signal;
   a plurality of parallel output stages coupled to said input stage for supplying output current to a load, each one of said output stages being connected to different power supply voltage levels; and
   control means coupled to said plurality of output stages for shifting the output current supplied to said load from one output stage to another based on the instantaneous relationship between said supply voltage levels and an output voltage developed across said load.

2. The amplifier according to claim 1 wherein said plurality of output stages each comprise an emitter follower circuit.

3. The amplifier according to claim 2 wherein said emitter follower circuits comprise Darlington-connected transistor pairs.

4. An amplifier circuit comprising:
   input means responsive to an input signal for producing a current proportional thereto;
   a plurality of output means, utilizing staggered supply voltage levels, coupled to said input means for supplying output current to a load, said output means being connected in parallel; and
   control means coupled to said plurality of output means for shifting enabling current proportionally from one output means to another output means based upon the instantaneous relationship between said supply voltage levels and an output voltage developed across said load to transfer said output current source from said one output stage to said another output stage.

5. The amplifier according to claim 4 wherein said plurality of output means each comprise an emitter follower circuit.

6. The amplifier according to claim 5 wherein said emitter follower circuits comprise Darlington-connected transistor pairs.

7. An electrical circuit including plural output stages and means for shifting current supplied to a load from one output stage to another output stage, comprising:
   a first output stage for supplying current to said load, said first output stage operated from a first voltage level source;
   a second output stage connected in parallel with said first output stage, said second output stage operated from a second voltage level source;
   a source of substantially constant enabling current connected to said first and said second output stages; and
   control means responsive to the instantaneous relationship between said voltage levels and an output voltage for reducing the percentage of enabling current to said first output stage while proportionally increasing the percentage of said enabling current to said second output stage, thereby shifting the output current supplied to said load from said first output stage to said second output stage.

8. The amplifier according to claim 7 wherein said first and second output stages each comprise an emitter follower circuit.

9. The amplifier according to claim 8 wherein said emitter follower circuits comprise Darlington-connected transistor pairs.

* * * * *